(12) United States Patent
Bentum et al.

(10) Patent No.: US 9,293,189 B2
(45) Date of Patent: Mar. 22, 2016

(54) INTEGRATED CIRCUITS WITH SRAM CELLS HAVING ADDITIONAL READ STACKS

(71) Applicant: GLOBALFOUNDRIES Inc., Grand Cayman (KY)

(72) Inventors: Ralf van Bentum, Moritzburg (DE); Torsten Klick, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/549,117

(22) Filed: Nov. 20, 2014

(65) Prior Publication Data

US 2015/0078068 A1    Mar. 19, 2015

Related U.S. Application Data

(62) Division of application No. 13/617,716, filed on Sep. 14, 2012, now Pat. No. 8,921,197.

(51) Int. Cl.
| | |
|---|---|
| *H01L 21/331* | (2006.01) |
| *G11C 11/4091* | (2006.01) |
| *G11C 11/412* | (2006.01) |
| *H01L 27/11* | (2006.01) |
| *H01L 27/02* | (2006.01) |

(52) U.S. Cl.
CPC .......... *G11C 11/4091* (2013.01); *G11C 11/412* (2013.01); *H01L 27/1104* (2013.01); *H01L 27/0207* (2013.01)

(58) Field of Classification Search
USPC .......................................................... 365/154
See application file for complete search history.

(56) References Cited

U.S. PATENT DOCUMENTS

| | | | | | |
|---|---|---|---|---|---|
| 5,991,517 | A | * | 11/1999 | Harari ................... | G06F 3/0601 711/E12.008 |
| 6,081,460 | A | * | 6/2000 | Lim ....................... | G11C 5/066 365/189.11 |
| 7,773,407 | B2 | * | 8/2010 | Huang ..................... | G11C 8/16 365/154 |
| 2009/0175070 | A1 | * | 7/2009 | Houston ............. | H01L 27/0207 365/154 |
| 2011/0317485 | A1 | * | 12/2011 | Liaw ...................... | H01L 27/11 365/182 |

* cited by examiner

*Primary Examiner* — Thao P Le
(74) *Attorney, Agent, or Firm* — Ingrassia Fisher & Lorenz, P.C.

(57) ABSTRACT

Integrated circuits that include SRAM cells having additional read stacks are provided. In accordance with one embodiment an integrated circuit includes a memory storage array of memory cells. The integrated circuit includes a read stack coupled to each memory cell of the memory storage array. Each read stack includes a read pull-down transistor having a first threshold voltage, and a read pass gate transistor coupled in series with the read pull down transistor and having a second threshold voltage greater than the first threshold voltage.

20 Claims, 5 Drawing Sheets

| 200 | 202 | 204 | 206 |
|---|---|---|---|
| Read Pull Down Transistor $V_T$ | Read Pass Gate Transistor $V_T$ | Read Current $I_{read}$ | Leakage Current $I_{leak}$ |
| High $V_T$ | High $V_T$ | 91.1 µA | 0.202 nA |
| Low $V_T$ | Low $V_T$ | 130 µA | 2.5 nA |
| Low $V_T$ | High $V_T$ | 104 µA | 0.215 nA |

US 9,293,189 B2

INTEGRATED CIRCUITS WITH SRAM CELLS HAVING ADDITIONAL READ STACKS

CROSS-REFERENCE TO RELATED APPLICATIONS

This is a divisional of U.S. application Ser. No. 13/617,716, filed Sep. 14, 2012.

TECHNICAL FIELD

The present disclosure generally relates to integrated circuits, and more particularly relates to integrated circuits that include SRAM cell having additional read stacks.

BACKGROUND

Microprocessors and other integrated circuits (ICs) often incorporate embedded memory such as static random access memory (SRAM). In certain of such ICs the access speed of such memory is of great importance, such as in a level 1 cache or in graphic processors. Although a six transistor (6-T) SRAM cell is the standard in many memory applications and especially in stand-alone memories, the 6-T cell may not be fast enough for high speed applications. For applications requiring high speed read access, a memory cell having separate read stack(s) such as an eight transistor (8-T) or ten transistor (10-T) SRAM cell is the memory cell of choice. SRAM cells with additional read stacks allow the memory state of the cell to be read without disturbing the state of the cell.

The read stack of an 8-T or 10-T SRAM cell includes a read pull down transistor and a read pass gate transistor coupled in series. The read performance of such a SRAM cell can be further enhanced by enhancing the pull-down capability of the read pull down transistor. Unfortunately, conventional methods for enhancing the pull-down capability of the read pull down transistor each come with a drawback. For example, the pull-down capability can be enhanced by increasing the width of the transistor channel or by decreasing the length of the channel since pull-down capability is proportional to the ratio of channel width to channel length (W/L). Increasing the channel width, however, results in a larger SRAM cell and decreasing the channel length can result in variability from device to device and in increased leakage current. Reducing the threshold voltage ($V_t$) of the read stack can increase the pull-down capability, but also increases the leakage current of the read stack.

Accordingly, it is desirable to provide integrated circuits having SRAM cells with additional read stacks that overcome the problems of conventional ICs. In addition, it is desirable to provide integrated circuits having SRAM cells with high read performance and low leakage current read stacks. Furthermore, other desirable features and characteristics will become apparent from the subsequent detailed description and the appended claims, taken in conjunction with the accompanying drawings and the foregoing technical field and background.

BRIEF SUMMARY

Integrated circuits that include SRAM cells having additional read stacks are provided. In accordance with one embodiment an integrated circuit includes a memory storage array of memory cells. The integrated circuit includes a read stack coupled to each memory cell of the memory storage array. Each read stack includes a read pull-down transistor having a first threshold voltage, and a read pass gate transistor coupled in series with the read pull down transistor and having a second threshold voltage greater than the first threshold voltage.

In accordance with a further embodiment, an integrated circuit includes a semiconductor substrate and SRAM cells in and on the semiconductor substrate. Each of the SRAM cells includes a read pull down transistor and a read pass gate transistor. Each of the read pull down transistors has a first threshold voltage. Each of the read pass gate transistors has a second threshold voltage different than the first threshold voltage.

In accordance with yet another embodiment, an integrated circuit is provided that includes a first N-channel field effect transistor having a first gate, a source, and a drain. The integrated circuit includes a second N-channel field effect transistor series coupled to the first N-channel field effect transistor and having a second gate, a source, and a drain. The first transistor has a first threshold voltage value. The second transistor has a second threshold voltage value greater than the first threshold voltage value. The integrated circuit further includes a node to be monitored that is coupled to the first gate. The integrated circuit also includes a first address selection line coupled to the second gate. The integrated circuit further includes a second address selection line coupled to the drain of the second transistor.

BRIEF DESCRIPTION OF THE DRAWINGS

The provide integrated circuits having SRAM cells with additional read stacks will hereinafter be described in conjunction with the following drawing figures, wherein like numerals denote like elements, and wherein.

DETAILED DESCRIPTION

The following detailed description is merely exemplary in nature and is not intended to limit the integrated circuits having SRAM cells with additional read stacks or the application and uses of such integrated circuits. Furthermore, there is no intention to be bound by any expressed or implied theory presented in the preceding technical field, background, brief summary or the following detailed description.

Figure 1:
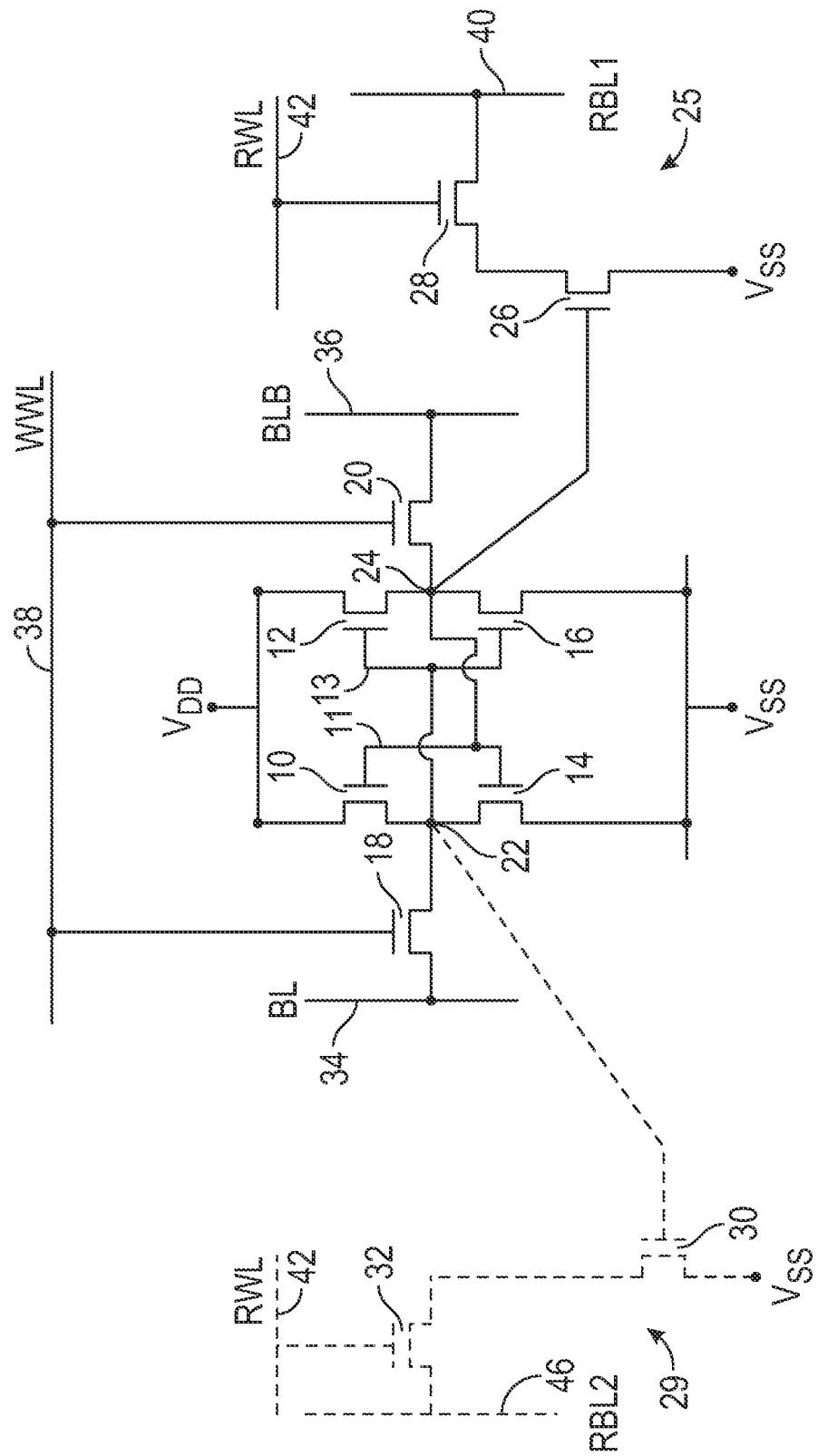
FIG. 1 illustrates in a circuit schematic drawing, an eight transistor static random access memory (8-T SRAM) cell and, in phantom, the additional transistors that would be included in a ten transistor (10-T) SRAM cell.

FIG. 1 illustrates in a circuit schematic drawing, an eight transistor static random access memory (8-T SRAM) cell and, in phantom, the additional transistors that would be included in a ten transistor (10-T) SRAM cell. In an integrated circuit (IC), a large number of such SRAM cells are arranged in a regular array in a memory section. The IC may be, for example, a microprocessor or other circuit function that includes a logic portion and an embedded memory portion. The 8-T SRAM cell includes two cross coupled inverters that provide a memory storage function. One inverter includes a pull up transistor 10 and a pull down transistor 14, with the two transistors sharing a common gate electrode 11. The other inverter includes a pull up transistor 12 and a pull down transistor 16 with a common gate electrode 13. The sources of pull up transistors 10 and 12 are coupled to a first voltage potential such as $V_{DD}$ and the sources of pull down transistors 14 and 16 are coupled to a second voltage potential such as $V_{SS}$. A pass gate transistor 18 is coupled to an output node 22 between pull up transistor 10 and pull down transistor 14 and to common gate electrode 13. A pass gate transistor 20 is coupled to an output node 24 between pull up transistor 12 and pull down transistor 16 and to common gate electrode 11. The drain of pass gate transistor 18 is coupled to a bit line (BL) 34 and the drain of pass gate transistor 20 is coupled to a complementary bit line (BLB) 36. The gates of pass gate transistors 18 and 20 are coupled to a write word line (WWL) 38. The 8-T SRAM cell has a read stack 25 that includes a read pull down transistor 26 coupled in series with a read pass gate transistor 28. The gate of read pull down transistor 26 is coupled to a node that is to be monitored, namely output node 24 of the memory storage function, and the source of read pull down transistor 26 is coupled to a voltage potential such as $V_{SS}$. The gate of read pass gate transistor 28 is coupled to a read word line (RWL) 42 and the drain of read pass gate transistor 28 is coupled to a read bit line (RBL1) 40. Read word line 42 and read bit line 40 serve as address selection lines for the read stack. When selected, read stack 25 allows the reading of the memory state of node 24 of the cross coupled inverter memory function without disturbing the memory state.

A 10-T SRAM cell includes all of the elements described above for an 8-T SRAM cell plus an additional read stack 29 that includes read pull down transistor 30 series coupled to read pass gate transistor 32. The gate of read pull down transistor 30 is coupled to a node that is to be monitored, namely output node 22, and the source of read pull down transistor 30 is coupled to a voltage potential such as $V_{SS}$. The gate of read pass gate transistor 32 is coupled to read word line 42 and the drain of read pass gate transistor 32 is coupled to a complementary read bit line (RBL2) 46. Read stack 29 functions similarly to read stack 25 and, when selected, allows the reading of the memory state of node 22 of the cross coupled inverter memory function without disturbing the memory state. In either embodiment, either the 8-T or the 10-T SRAM cell, the pull up transistors 10 and 12 are typically P-channel field effect transistors (PFETs) and all other transistors of the memory cell are typically N-channel field effect transistors (NFETs).

Consider a read operation of the 8-T SRAM cell. When the read stack is addressed by signals that pull both the read bit line 40 and the read word line 42 high, the source potential of read pass gate transistor 28 will be either high or low depending on the potential stored on node 24; that is, on the data stored in the memory function by the cross coupled inverters. If the data stored in the cell at node 24 is a high potential, read pull down transistor 26 will turn on or conduct, the potential at the source of read pass gate transistor 28 will be low, and read bit line 40 will be pulled low. If the data stored in the cell at node 24 is a low potential, read pull down transistor 26 will not turn on and will hence remain non-conductive, and the potential on the source of read pass gate 28 and on read bit line 40 will remain high. In a similar manner read stack 29 is able to read the data stored on node 22 of a 10-T SRAM cell.

Both the read pull down transistor and the read pass gate transistor determine the performance of the read stack and hence the performance of a read operation. In order to enhance the performance of the read stack, ideally the read pull down transistor (26 or 30) should be less resistive relative to the read pass gate transistor (28 or 32) in order to allow the source potential of the read pass gate transistor to be low and hence result in a high pass gate performance when the data stored at the output node causes the read pull down transistor to turn on. Leakage current is another measure of the performance of the read stack. Such leakage is mainly determined by the read pass gate transistor, so it is advantageous to have the read pass gate transistor relatively more resistive than the read pull down transistor.

The resistance of a FET is influenced by a number of factors such as channel width, channel length, and threshold voltage. For example, the resistance of a FET is inversely proportional to the ratio of the width to the length of the channel. Increasing the width of the read pull down transistor, however leads to an undesirable increase in the size of the SRAM cell. Since the IC may include many thousands or even millions of SRAM cells, even a small increase in cell size can result in a significant increase in the size of the total IC. The resistance of the read pull down transistor can be reduced by decreasing the channel length, but very small channel lengths are hard to control and lead to variability across an individual IC and from IC to IC. A low threshold voltage ($V_t$) can lower the resistance of the read pull down transistor, but implementing the read pull down transistor and the read pass gate transistor with the same low threshold voltage leads to an undesirable increase in leakage current. Implementing the read stack with the same, but relatively high, $V_t$ for both the read pull down transistor and the read pass gate transistor can achieve the desired low leakage current, but fails to achieve the desired low resistance for the read pull down transistor. Therefore, in accordance with an embodiment of the present disclosure, the performance of an IC that includes an embedded SRAM with an additional read stack is enhanced by fabricating the read stack in such a manner that the read pull down transistor has a lower threshold voltage than the read pass gate transistor. Such an implementation achieves the dual objectives of a high performance read operation with low current leakage. It is desirable, from a cost standpoint, to achieve the performance enhancement without adding any additional steps to the fabrication process. Threshold voltage values are typically adjusted by implanting conductivity-determining impurity ions into the channel region of selected transistors while photolithographically masking other transistors. Thus it is advantageous if the performance enhancement can be achieved without adding any ion implantation steps or lithography masks or masking operations.

Figure 2:
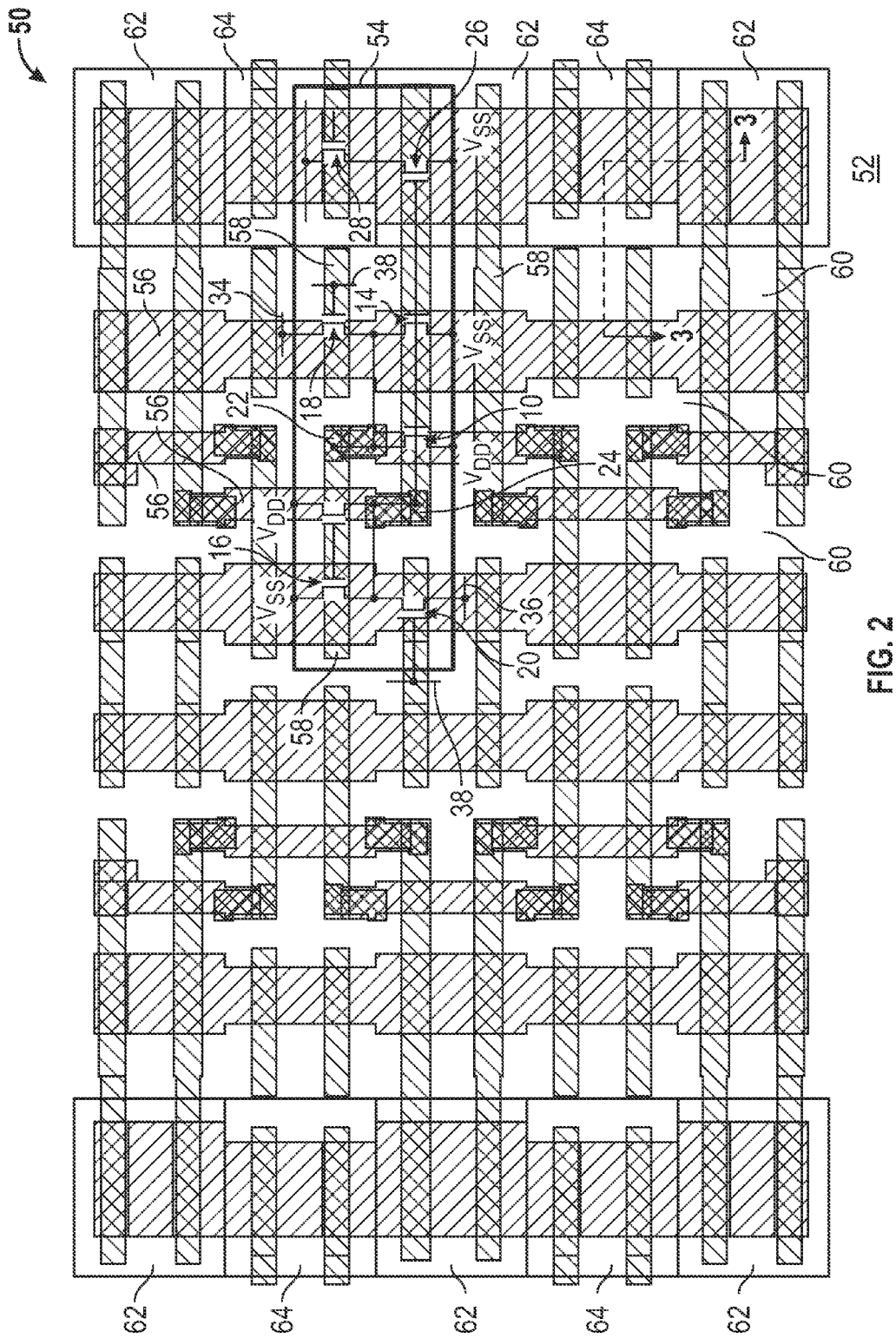
FIG. 2 illustrates, in plan view, a composite of photolithography mask layers, in accordance with one embodiment, used to fabricate a portion of a memory as part of an IC.

FIG. 2 illustrates, in plan view, a composite of photolithography mask layers, in accordance with one embodiment, used to fabricate a portion of a memory 50 as part of an IC 52. IC 52 can be, for example, a complex integrated circuit, such as a microprocessor, that includes a logic portion as well as a memory portion. The memory portion, as illustrated, is implemented as an embedded 8-T SRAM. The memory portion of IC 52 may include a large number of SRAM cells, only a few of which are illustrated in FIG. 2. Line 54 delineates one 8-T SRAM of memory 50. As can be seen, the layout of the single SRAM cell is repeated over and over in the FIGURE to provide a regular array of memory cells. The photolithographic mask layers are used, in conventional manner, to form device regions and elements that are used to implement the desired memory circuit function. Illustrated in FIG. 2 are mask layers to delineate the active semiconductor regions 56, gate electrode structures 58, isolation regions 60, and, in accordance with one embodiment, ion implantation masks 62 and 64 for selectively implanting read pull down devices and read pass gate devices, respectively. The location of transistors identified in the circuit schematic drawing of FIG. 1 are overlaid on the photolithographic composite to illustrate how those transistors are fabricated to implement the desired 8-T SRAM cell.

The logic portion of IC 52 is typically fabricated with a number of different threshold voltage values for various transistors that are used to implement the intended circuit function. The different threshold voltage values are achieved by implanting controlled concentrations and types of conductivity-determining impurity ions into the channel region of the various transistors. As is well known, during the various implantations, implant masks, usually patterned layers of photoresist, are used to mask transistors that are not to be implanted while exposing other transistors to the implanted ions. The various threshold voltage values can be roughly categorized as high $V_t$, medium $V_t$, and low $V_t$. In an IC for which the maximum supply voltage is 1 volt, the $V_t$ values for the three categories could be, for example, 0.6-0.7 v, 0.4-0.5 v, and 0.3-0.4 v, respectively. In accordance with one embodiment, the threshold voltage values selected for the read pull down transistor and the read pass gate transistor of the read stack are selected from the threshold voltage values used elsewhere in the logic portion of IC 52.

FIGS. 3-9 illustrate, in a cross section taken along the line 3-3, process steps for fabricating IC 52 in accordance with various embodiments. Various steps in the design and composition of integrated circuits are well known and so, in the interest of brevity, many conventional steps will only be mentioned briefly herein or will be omitted entirely without providing the well-known process details. IC 52 can be fabricated with either a gate first or a gate last process, but embodiments herein will be illustrated only with a gate last process. Those of skill in the art will understand that any process steps that relate to the fabrication of read stack 25 in an 8-T SRAM cell will also apply to the fabrication of both read stack 25 and read stack 29 in a 10-T SRAM cell. In other words, the process described will apply equally to circuits having cells with one read stack or to those having a plurality of read stacks.

Figure 3:
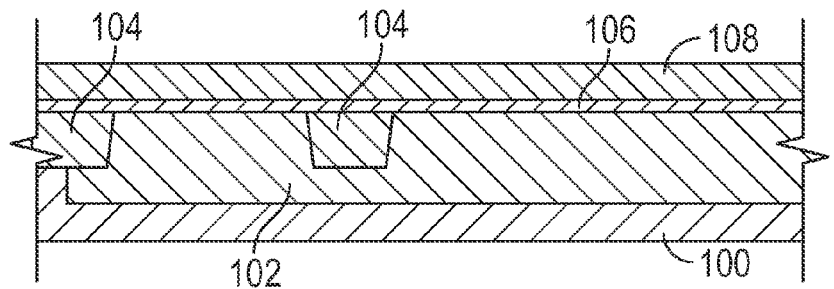
FIGS. 3-9 illustrate, in cross sectional views, method steps in accordance with various embodiments for fabricating an IC having SRAM cells including additional read stacks.

As illustrated in FIG. 3, the process for fabricating an IC that includes an SRAM cell array in which each of the cells has a read stack such as read stack 25, in accordance with one embodiment, begins by providing a semiconductor substrate 100. The semiconductor substrate can be silicon, silicon admixed with germanium or other elements, germanium, or other semiconductor materials, and can be a bulk semiconductor substrate (as illustrated) or a semiconductor on insulator (SOI) substrate. Only a portion of the memory portion of IC 52 and none of the logic portion is illustrated, but the same processing steps described below are also applied to the logic portion of the IC. Substrate 100 is implanted with conductivity determining impurity ions to form N-type wells (not illustrated in this cross sectional view) and P-type wells 102. PFETs such as pull up transistors 10 and 12 as well as the PFETs necessary to form the logic portion of IC 52 will be formed in the N-type wells. NFETs such as pull down transistors 14 and 16, pass gate transistors 18 and 20, and read stack transistors 26 and 28 will be formed in P-type wells 102. Isolation 60 is provided as needed between unrelated transistor by forming isolation regions 104 such as shallow trench isolation (STI). A layer of dummy gate insulator material 106 such as a silicon oxide and a layer of dummy gate electrode material such as polycrystalline silicon 108 are formed overlying semiconductor substrate 100.

Figure 4:
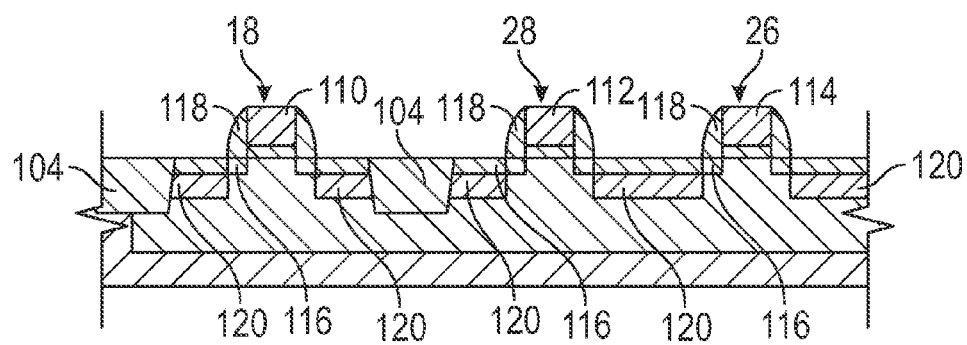

As illustrated in FIG. 4, the process in accordance with one embodiment continues by patterning the layer of dummy gate electrode material and the layer of dummy gate insulator material to form dummy gate structures 110, 112, and 114, the dummy gate structures for transistors 18, 28, and 26, respectively. The dummy gate structures are used as ion implantation masks for the formation of source and drain extensions 116 and for halo implants (not illustrated), as needed. Sidewall spacers 118 are formed on the walls of the dummy gate structures and the sidewall spacers together with the dummy gate electrodes are used as ion implantation masks for the formation of deep source and drain regions 120. As is well known, regions such as where the PFETs are formed can be protected by a layer of patterned photoresist during the implantation of the N-type source and drain regions. Although not illustrated, other processing steps such as siliciding the source and drain regions can also be done using the sidewall spacers as masks.

Figure 5:
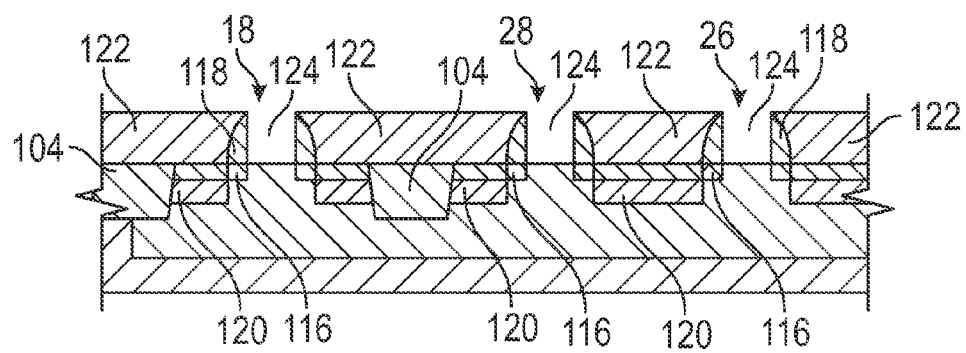

The process continues, in accordance with one embodiment, by depositing and planarizing an insulator layer 122 as illustrated in FIG. 5. The planarization, for example by chemical mechanical planarization (CMP), continues until the tops of the dummy gate structures are exposed. The dummy gate structures can then be removed to leave recesses 124 in the insulator layer.

Figure 6:
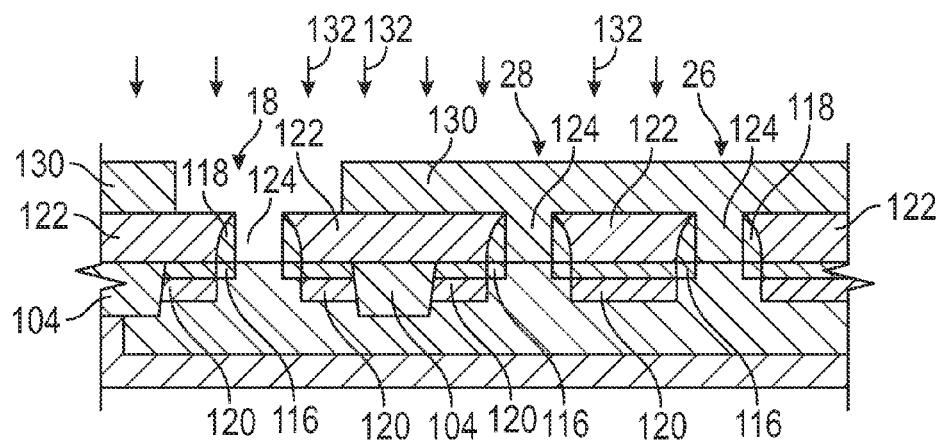
Figure 7:
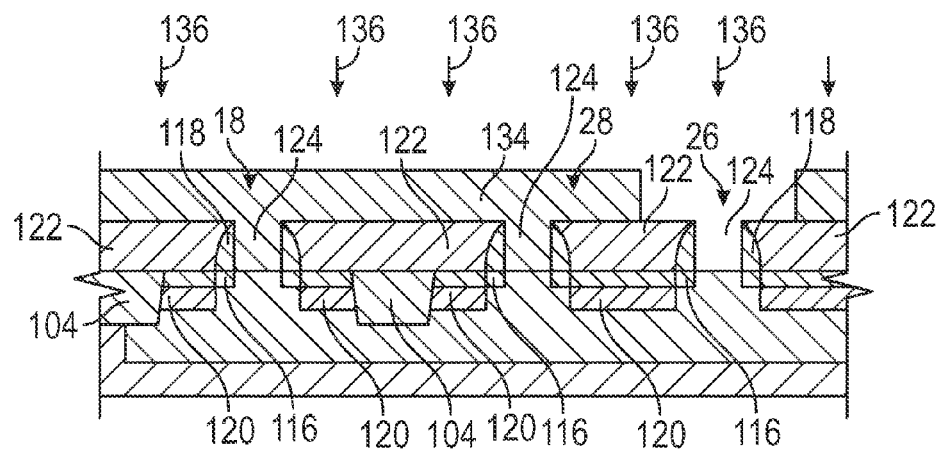
Figure 8:
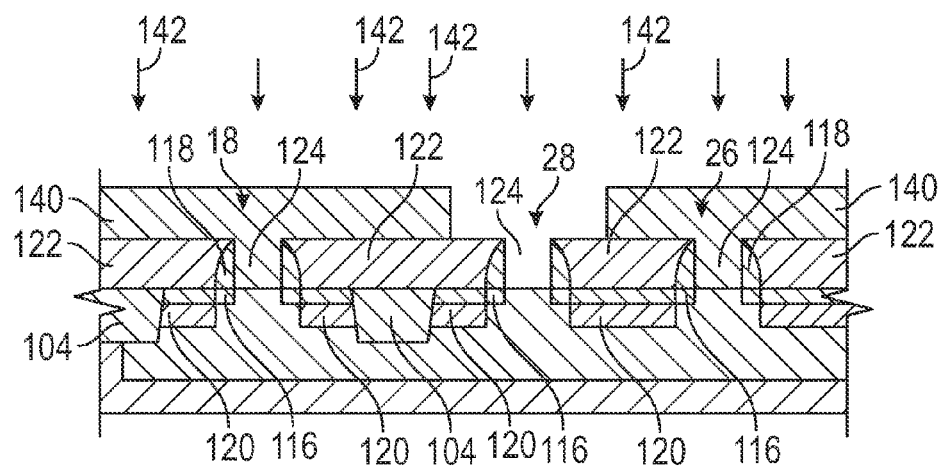

As illustrated in FIGS. 6-8, in accordance with an embodiment, photoresist layers are applied and patterned to selectively expose the channel regions of transistors 18, 26, and 28 located in the semiconductor substrate below recesses 124 in insulator layer 122. Conductivity determining impurity ions are implanted into the respective channels to adjust the threshold voltages of transistors 18, 26, and 28. The same implantations are used to establish desired threshold voltages in the transistors of the logic portion of IC 52. The FIGURES show that only one of the transistors 18, 26, or 28 is exposed at a time to receive an implantation of ions. In an alternate embodiment more than one transistor is implanted at a time and, in a separate masking operation, different transistors are implanted. That is, for example, two or more of the transistors can receive a first implant of a first concentration of a dopant species. Then one or more of those transistors can receive a second implant of a second concentration of the same or different dopant species. For example, the channels of transistor 18 and transistor 26 may both be implanted with a given concentration of arsenic ions to establish a first, medium $V_t$ in pass gate transistor 18. Subsequently, the channel of transistor 26, but not of transistor 18 can be implanted again with a second concentration of arsenic ions to establish a second, low $V_t$ in read pull down transistor 26.

As illustrated in FIG. 6, in accordance with one embodiment a layer of photoresist or other masking material 130 is applied and patterned to form an ion implant mask that exposes the channel of transistor 18 while masking transistors 26 and 28. The same mask could also expose the channel region of pass gate transistor 20, pull down transistors 14 and 16, as well as the channel regions of some transistors in the logic portion of IC 52. With the patterned mask layer in place, conductivity determining impurity ions at a selected concentration are implanted into the channel of transistor 18 as illustrated by arrows 132 to establish the desired threshold voltage. As discussed above, transistor 18 and others having like threshold voltages may also be subjected to subsequent ion implantations to finish establishing the desired threshold voltage. The conductivity determining impurity ions can be either N-type such as phosphorous or arsenic to lower the threshold voltage value or P-type such as boron to enhance the doping in P-type well region 102 and to raise the threshold voltage value.

The method in accordance with one embodiment continues by removing patterned masking material 130 and applying and patterning a further layer of making material 134 as illustrated in FIG. 7. Patterned masking layer 134 exposes the channel region of transistor 26 while masking transistors 18 and 28. With the patterned mask layer in place, conductivity determining impurity ions are implanted into the channel of transistor 26 as illustrated by arrows 136 to establish the desired threshold voltage. The type and concentration of implanted impurity ions can be selected to achieve the desired $V_t$. In accordance with one embodiment the resulting threshold voltage is lower than the threshold voltage of transistor 18. If the SRAM array of IC 52 consists of 10-T SRAM cells, the same impurities are implanted into read pull down transistor 30 so that transistors 26 and 30 have the same threshold voltage.

The method further continues as illustrated in FIG. 8. Patterned masking layer 134 is removed and another masking layer 140 is formed overlying semiconductor substrate 100 to expose the channel of transistor 28 and to mask transistors 18 and 26. Conductivity-determining impurity ions are implanted into the channel region of transistor 28 as illustrated by arrows 142 to establish the desired threshold voltage for transistor 28. The type and concentration of implanted impurity ions can be different than the impurity ions implanted into the channel of read pull down transistor 26 and can be selected to achieve the desired $V_t$. In accordance with one embodiment the resulting threshold voltage of transistor 28 is higher than the threshold voltage of transistor 26. As explained above, if the SRAM array of IC 52 consists of 10-T SRAM cells, the same impurities are implanted into read pass gate transistor 32 so that transistors 28 and 32 have the same threshold voltage.

The order in which the ion implantations illustrated in FIGS. 6-8 are performed is not important. As explained above, the illustrated ion implantations may be combined to achieve the desired threshold voltage. That is, for example, the implant illustrated by arrows 132 may also be directed to the channel of transistor 26 in addition to the channel of transistor 18. It is advantageous, because of cost issues and reduction in process complexity, if the ion implant species and concentrations and the implant masks used to establish the threshold voltages of the SRAM transistors are the same as those used in fabrication of transistors in the logic portion of IC 52.

Figures 9, 10:
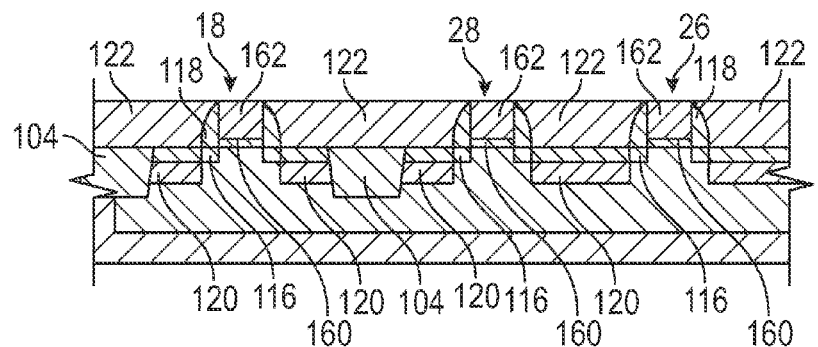
FIG. 10 presents, in tabular form, simulated results for an SRAM cell having different read stack threshold voltage values.

After completing the ion implants used to establish the desired threshold voltages of all the transistors, the remaining implant mask materials are removed and a permanent gate structure is formed as illustrated in FIG. 9. The permanent gate structure includes a gate insulator 160 and a gate electrode 162. The gate insulator can be, for example, a layer of silicon dioxide, a layer of high dielectric material such as an oxide of hafnium or the like, or a combination of insulating layers. Gate electrode 162 can be, for example, doped polycrystalline silicon or a metal such as aluminum or an alloy of aluminum. The permanent gate structure may also include work function-determining layers, barrier layers, and the like.

Although not illustrated, those of skill in the art will understand that other processing steps may be used in fabricating an IC such as IC 52. Additional processing steps include, for example, embedding stress inducing materials into source and drain regions, depositing stress inducing insulating layers, etching and filling contact vias, forming conductive interconnect layers separated by interlayer dielectrics, and the like. In accordance with a further embodiment, adjusting the threshold voltages of the various transistors can be accomplished, at least partially, by directing angled implants into the channel region after the gate structure is formed.

FIG. 10 presents, in tabular form, simulated results for an SRAM cell having different read stack threshold voltage values. Column 200 indicates the threshold voltage type for the read pull down transistor, column 202 indicates the threshold voltage type for the read pass gate transistor, column 204 indicates the simulated read current $I_{read}$ that would result from the various $V_t$ types, and column 206 indicates the simulated leakage current $I_{leak}$, that would result from the various $V_t$ types. Row 208 represents the conventional situation in which both the read pull down and the read pass gate transistors have a high $V_t$. Row 210 represents the conventional situation in which both the read pull down and the read pass gate transistors have a low $V_t$. Row 212 represents the situation consistent with the embodiments disclosed herein in which the read pull down transistor has a low $V_t$ and the read pass gate transistor has a high $V_t$. The simulation shows that when both read stack transistors have a high $V_t$ (Row 208), the leakage current is low, but the read current is also low. The simulation also shows that when both read stack transistors have a low $V_t$ (Row 210), the read current is high, but the leakage current is more than an order of magnitude higher than for the results in Row 208. As indicated in Row 212, when the read pull down transistor has a low $V_t$ and the read pass gate transistor has a high $V_t$, the read current is about 14% higher than the read current in Row 208, but the leakage current is substantially the same as the leakage current in Row 210. Clearly the read stack in accordance with the embodiments disclosed herein provides superior read performance.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:

1. An integrated circuit comprising:
   a memory storage array of memory cells; and
   a read stack coupled to each memory cell of the memory storage array, each read stack comprising:
      a read pull-down transistor having a first threshold voltage; and
      a read pass gate transistor coupled in series with the read pull down transistor and having a second threshold voltage greater than the first threshold voltage.

2. The integrated circuit of claim 1 wherein each memory cell has two cross coupled inverters.

3. The integrated circuit of claim 2 the read pull-down transistor includes a gate electrode coupled to an output node of one of the inverters.

4. The integrated circuit of claim 3 further comprising a second read pull down transistor coupled in series with a second read pass gate transistor, the second read pull down transistor having the first threshold voltage and the second read pass gate transistor having the second threshold voltage and a gate electrode of the second read pull down transistor coupled to an output node of the other of the inverters.

5. An integrated circuit comprising:
a semiconductor substrate;
SRAM cells in and on the semiconductor substrate, wherein each of the SRAM cells includes a read pull down transistor and a read pass gate transistor, wherein each of the read pull down transistors has a first threshold voltage, and wherein each of the read pass gate transistors has a second threshold voltage different than the first threshold voltage.

6. The integrated circuit of claim 5 wherein the SRAM cells are in a memory portion of the integrated circuit, and wherein the integrated circuit further comprises:
a logic portion;
a first transistor in the logic portion, wherein the first transistor has the first threshold voltage.

7. The integrated circuit of claim 6 further comprising a second transistor in the logic portion, wherein the second transistor has the second threshold voltage.

8. The integrated circuit of claim 5 wherein each SRAM cell further comprises a second read pull down transistor and a second read pass gate transistor, wherein each second read pull down transistor has the first threshold voltage, and wherein each second read pass gate transistor has the second threshold voltage.

9. The integrated circuit of claim 5 wherein each SRAM cell comprises a cross coupled inverter.

10. The integrated circuit of claim 9 wherein each SRAM cell includes a pull down transistor, and wherein each pull down transistor has a third threshold voltage different from the first threshold voltage and the second threshold voltage.

11. The integrated circuit of claim 10 wherein each read pull down transistor includes a gate electrode, and wherein each gate electrode is coupled to an output node of one of the cross coupled inverters.

12. The integrated circuit of claim 11 wherein each SRAM cell further comprises a second read pull down transistor and a second read pass gate transistor, wherein each second read pull down transistor includes a gate electrode, and wherein the gate electrode of the second read pull down transistor is coupled to an output node of the other of the cross coupled inverters.

13. The integrated circuit of claim 5 wherein the second threshold voltage is higher than the first threshold voltage.

14. An integrated circuit comprising:
a first N-channel field effect transistor having a first gate, a source, and a drain, wherein the first transistor has a first threshold voltage value;
a second N-channel field effect transistor series coupled to the first N-channel field effect transistor and having a second gate, a source, and a drain, wherein the second transistor has a second threshold voltage value greater than the first threshold voltage value;
a node to be monitored, wherein the first gate is coupled to the node to be monitored and wherein the first N-channel field effect interconnects the node to be monitored and the second N-channel field effect transistor;
a first address selection line, wherein the second gate is coupled to the first address selection line; and
a second address selection line, wherein the drain of the second transistor is coupled to the second address selection line.

15. The integrated circuit of claim 14 wherein the first N-channel field effect transistor comprises a channel region doped with first conductivity-determining impurity ions of a first dopant concentration and wherein the second N-channel field effect transistor comprises a channel region doped with second conductivity-determining impurity ions of a second dopant concentration.

16. The integrated circuit of claim 14 further comprising:
a logic portion;
a first transistor in the logic portion, wherein the first transistor has the first threshold voltage.

17. The integrated circuit of claim 16 further comprising a second transistor in the logic portion, wherein the second transistor has the second threshold voltage.

18. The integrated circuit of claim 14 wherein the node to be monitored is a memory cell node.

19. The integrated circuit of claim 14 wherein the first address selection line is a read word line and the second address selection line is a read bit line.

20. The integrated circuit of claim 1 wherein each memory cell includes an invertor, wherein the read pull-down transistor includes a gate electrode coupled to an output node of the inverter, and wherein the read pull-down transistor is connected between the output node and the read pass gate transistor.

* * * * *